(12) United States Patent
Cho et al.

(10) Patent No.: US 7,903,410 B2
(45) Date of Patent: Mar. 8, 2011

(54) PACKAGE BOARD AND METHOD FOR MANUFACTURING THEREOF

(75) Inventors: Suk-Hyeon Cho, Suwon-si (KR);
Je-Gwang Yoo, Yongin-si (KR);
Min-Sang Lee, Suwon-si (KR);
Seon-Goo Lee, Gunpo-si (KR);
Han-Seo Cho, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 327 days.

(21) Appl. No.: 12/010,879

(22) Filed: Jan. 30, 2008

(65) Prior Publication Data
US 2008/0198552 A1    Aug. 21, 2008

(30) Foreign Application Priority Data
Feb. 15, 2007  (KR) .................. 10-2007-0015745

(51) Int. Cl.
*H05K 7/20* (2006.01)
*H01L 23/34* (2006.01)
*H01L 33/00* (2006.01)

(52) U.S. Cl. ......... 361/704; 361/707; 361/714; 361/718; 257/99; 257/100; 257/706; 257/707; 257/713; 362/294; 362/373; 438/122

(58) Field of Classification Search .............. 361/679.54, 361/704, 707, 714–719; 257/98–100, 706, 257/712–713, E33.075; 362/373, 394, 294; 438/122
See application file for complete search history.

(56) References Cited

U.S. PATENT DOCUMENTS

| 6,060,778 | A  | * | 5/2000 | Jeong et al.  | 257/710 |
| 6,940,101 | B2 | * | 9/2005 | Yano et al.   | 257/98  |
| 6,949,772 | B2 | * | 9/2005 | Shimizu et al.| 257/99  |
| 7,045,828 | B2 | * | 5/2006 | Shimizu et al.| 257/98  |
| 7,250,637 | B2 | * | 7/2007 | Shimizu et al.| 257/98  |
| 7,259,403 | B2 | * | 8/2007 | Shimizu et al.| 257/99  |
| 7,334,907 | B2 | * | 2/2008 | Nagayama      | 362/84  |
| 7,375,381 | B2 | * | 5/2008 | Shimizu et al.| 257/98  |

(Continued)

FOREIGN PATENT DOCUMENTS

CN   1199927 A   11/1998

(Continued)

OTHER PUBLICATIONS

Chinese Office Action issued Feb. 25, 2010 in corresponding Chinese Patent Application 200810007910.7.

(Continued)

*Primary Examiner* — Robert J Hoffberg

(57) ABSTRACT

A package board and a method for the manufacturing of the package board are disclosed. A package board, which includes a first metal layer, a heat-release layer stacked on the first metal layer with a first insulation layer interposed in-between, a cavity formed in the heat-release layer, a mounting layer formed in the cavity in contact with the first insulation layer, a first component mounted on the mounting layer, and a second insulation layer covering at least a portion of the heat-release layer and the cavity, may offer improved heat release and smaller thickness.

7 Claims, 32 Drawing Sheets

U.S. PATENT DOCUMENTS

| | | | |
|---|---|---|---|
| 7,518,155 B2* | 4/2009 | Ishidu et al. | 257/98 |
| 7,683,393 B2* | 3/2010 | Nagai et al. | 257/98 |
| 2005/0199900 A1* | 9/2005 | Lin et al. | 257/99 |
| 2006/0157722 A1* | 7/2006 | Takezawa et al. | 257/98 |
| 2007/0029570 A1* | 2/2007 | Shin et al. | 257/99 |
| 2007/0096137 A1* | 5/2007 | Yamauchi | 257/99 |
| 2007/0126020 A1* | 6/2007 | Lin et al. | 257/100 |
| 2008/0061314 A1* | 3/2008 | Liaw et al. | 257/99 |
| 2008/0290363 A1* | 11/2008 | Lin et al. | 257/99 |
| 2008/0296599 A1* | 12/2008 | Mazzochette | 257/98 |
| 2009/0026485 A1* | 1/2009 | Urano et al. | 257/99 |
| 2009/0039382 A1* | 2/2009 | Su | 257/99 |
| 2009/0146158 A1* | 6/2009 | Park | 257/89 |

FOREIGN PATENT DOCUMENTS

| | | |
|---|---|---|
| JP | 2003-249621 | 9/2003 |
| JP | 2006-49814 | 2/2006 |
| JP | 2006-303359 | 11/2006 |

OTHER PUBLICATIONS

Japanese Office Action issued Oct. 26, 2010 in corresponding Japanese Patent Application 2008-019693.

* cited by examiner

PACKAGE BOARD AND METHOD FOR MANUFACTURING THEREOF

CROSS-REFERENCE TO RELATED APPLICATIONS

This application claims the benefit of Korean Patent Application No. 10-2007-0015745 filed with the Korean Intellectual Property Office on Feb. 15, 2007, the disclosure of which is incorporated herein by reference in its entirety.

BACKGROUND

1. Technical Field

The present invention relates to a package board.

2. Description of the Related Art

A market currently receiving the spotlight is the market for optical components, such as LED's and image sensors, etc. Here, products with high luminance are required for LED's, and products with high resolution are required for image sensors.

Such optical components may be installed on a board, but when the components are surface-mounted, these may pose a limit on how thin the board can be made.

When installing a component inside a printed circuit board (PCB) according to the related art, there is a limit to implementing heat release, because the insulation layer is made of a polymer material.

A method of using a metal core has been proposed for resolving the problem of heat release, but in this case also, the component and the metal core are separated from each other, so that a thermal barrier still exists.

SUMMARY

An aspect of the invention is to provide a package board, and a method for the manufacturing of the package board, which improves heat release and which allows a smaller thickness.

One aspect of the invention can provide a package board, which includes: a first metal layer; a heat-release layer stacked on the first metal layer with a first insulation layer interposed in-between; a cavity formed in the heat-release layer; a mounting layer formed in the cavity in contact with the first insulation layer; a first component mounted on the mounting layer; and a second insulation layer covering at least a portion of the heat-release layer and the cavity.

The package board may further include a first electrode portion that is isolated from the mounting layer and the heat-release layer, where the first component and the first electrode portion may be electrically connected by wire bonding.

The first component may be a light-emitting element, and in order that heat generated from the first component may be transferred to the heat-release layer, the mounting layer may be connected with the heat-release layer.

The sum of the thickness of the mounting layer and the thickness of the first component can be smaller than the thickness of the heat-release layer. The second insulation layer can be made of a transparent material, and a curve can be formed in a portion of the second insulation layer that covers the cavity.

In certain embodiments, the package board may also include a second component that is mounted on an upper surface of the first component, and a second electrode part that is isolated from the mounting layer and the heat-release layer, where the second component and the second electrode portion may be electrically connected by wire bonding.

Also, a second metal layer stacked on the second insulation layer may further be included, where a pre-designed pattern can be formed in the second metal layer such that the light generated by the first component may be selectively transmitted.

Another aspect of the invention can provide a package board that includes: a first metal layer; a heat-release layer stacked on the first metal layer with a first insulation layer interposed in-between; a cavity formed in the heat-release layer; a first component embedded in the cavity; a second insulation layer that covers the cavity and the heat-release layer; and a pillar which is isolated from the heat-release layer and which penetrates the second insulation layer.

The first component can be a light-emitting element, and the second insulation layer can be made of a transparent material, while a curve can be formed in a portion of the second insulation layer covering the cavity.

A mounting layer may further be included, which is stacked on the first insulation layer and on which the first component may be mounted, as well as a first electrode portion, which is isolated from the mounting layer and the heat-release layer, where the first component and the first electrode portion may be electrically connected by wire bonding.

Certain embodiments may have the package board additionally including a second component, mounted on an upper surface of the first component, and a second electrode part, isolated from the mounting layer and the heat-release layer, where the second component and the second electrode portion may be electrically connected by wire bonding.

The package board may also further include a third insulation layer stacked on the second insulation layer, and a second metal layer stacked on the third insulation layer. A via may additionally be included, which penetrates the third insulation layer to electrically connect the second metal layer and the pillar.

The second insulation layer and the third insulation layer can be made of the same material, and a pre-designed pattern can be formed in the second metal layer that allows the light generated by the first component to be selectively transmitted.

Still another aspect of the invention can provide a method of manufacturing a package board. The method includes: providing a first metal layer and a heat-release layer stacked together with a first insulation layer interposed in-between; etching a portion of the heat-release layer in correspondence to a first electrode portion such that the heat-release layer is penetrated; forming a mounting layer, on which a first component is to be mounted, and the first electrode portion by etching a portion of the heat-release layer; mounting the first component on the mounting layer and electrically connecting the first component with the first electrode portion; and stacking a second insulation layer such that the second insulation layer covers the first component and at least a portion of the heat-release layer.

The stacking of the second insulation layer can be performed by molding using a liquid insulation material, while the etching the heat-release layer can be performed by electropolishing or electro-discharge grinding.

In certain embodiments, the method may further include: forming a second electrode portion isolated from the heat-release layer by etching a portion of the heat-release layer; and mounting a second component on an upper surface of the first component and electrically connecting the second component and the second electrode portion.

Also, the operations of stacking a second metal layer on the second insulation layer, and forming a pre-designed pattern on the second metal layer may further be included.

Yet another aspect of the invention can provide a method of manufacturing a package board that includes: providing a first metal layer and a heat-release layer stacked together with a first insulation layer interposed in-between; forming a cavity and a pillar isolated from the heat-release layer by etching a portion of the heat-release layer such that the heat-release layer is penetrated; etching the heat-release layer excluding the pillar by a predetermined thickness; embedding a first component in the cavity; and stacking a second insulation layer such that the second insulation layer covers the cavity and the heat-release layer but leaves an end of the pillar exposed.

Stacking the second insulation layer can be performed by molding using a liquid insulation material, while forming the pillar can be performed by electropolishing or electro-discharge grinding.

An operation of stacking a third insulation layer on the second insulation layer may further be included, where the third insulation layer can be made of the same material as that of the second insulation layer.

The method of manufacturing a package board according to certain embodiments of the invention may further include stacking a second metal layer on the third insulation layer, and forming a pre-designed pattern on the second metal layer.

Additional aspects and advantages of the present invention will be set forth in part in the description which follows, and in part will be obvious from the description, or may be learned by practice of the invention.

DETAILED DESCRIPTION

Figure 1:
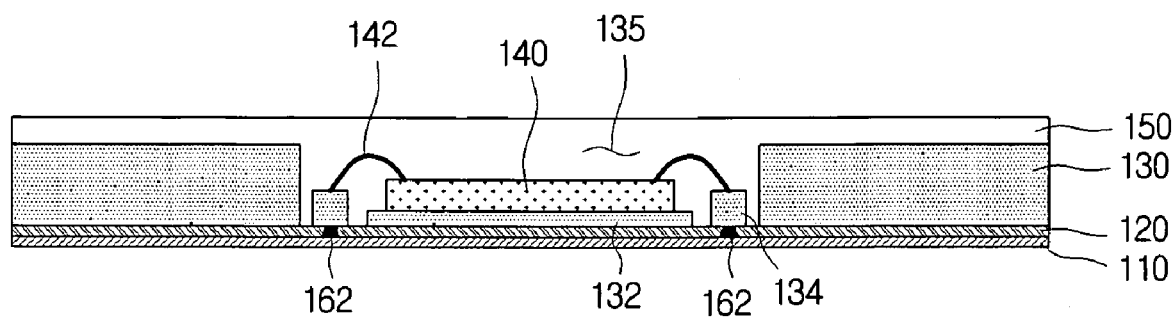
FIG. 1 is a cross-sectional view illustrating a first disclosed embodiment of a package board according to an aspect of the invention.

Embodiments of the invention will be described below in more detail with reference to the accompanying drawings. Those elements that are the same or are in correspondence are rendered the same reference numeral regardless of the figure number, and redundant explanations are omitted.

Figure 2:
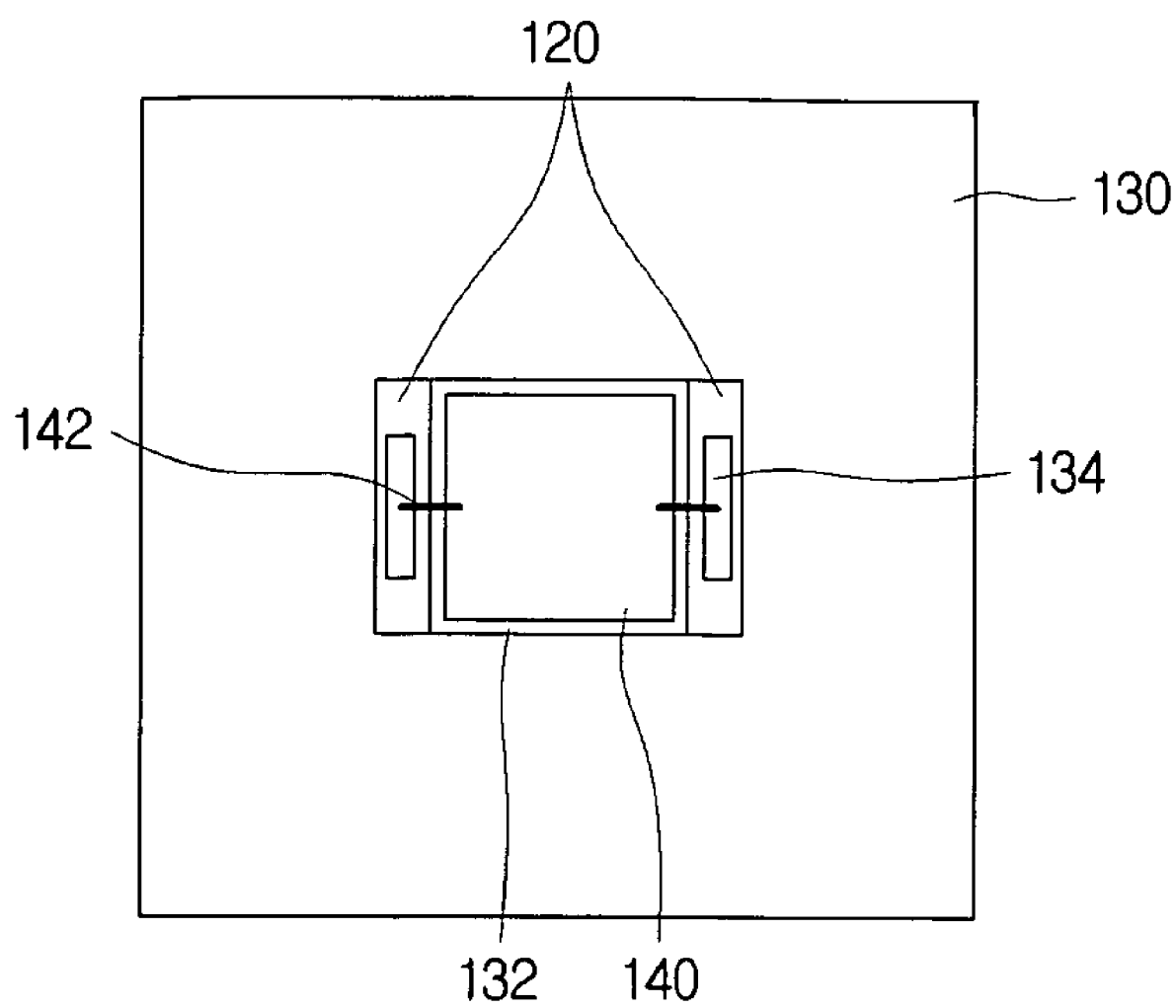
FIG. 2 is a plan view illustrating the package board of FIG. 1.

FIG. 1 is a cross-sectional view illustrating a first disclosed embodiment of a package board according to an aspect of the invention, and FIG. 2 is a plan view illustrating the package board of FIG. 1. In FIGS. 1 and 2 are illustrated a first metal layer 110, a first insulation layer 120, a heat-release layer 130, a mounting layer 132, electrode portions 134, a component 140, wires 142, a second insulation layer 150, and vias 162.

A particular circuit pattern (not shown) can be formed in the first metal layer 110, and a first insulation layer 120 may be stacked on the first metal layer 110. Vias may be formed in the first insulation layer 120 that connect the particular circuit pattern formed in the first metal layer 110 with the electrode portions 134 described later.

On the first insulation layer 120, a heat-release layer 130 may be stacked on. The heat-release layer 130 can be made of a metallic material having high thermal conductivity. Of course, other materials besides metals that have high thermal conductivity can be used just as well.

A copper clad laminate (CCL) having a thick copper foil formed on one side can be used instead of the first metal layer 110, first insulation layer 120, and heat-release layer 130 of this embodiment. In this case, the thick copper foil may correspond to the heat-release layer 130.

A cavity 135 can be formed in the heat-release layer 130 in which the component may be embedded. The cavity 135 may refer to the space within the heat-release layer 130 in which the component 140 may be embedded. This cavity 135 can be formed by etching a portion of the heat-release layer 130.

A mounting layer 132 can be formed in the cavity 135 on which a component may be mounted. Similar to the heat-release layer 130, the mounting layer 132 may be made of a material high in thermal conductivity, such as copper, in order to increase heat release.

The sum of the thickness of the mounting layer 132 and the thickness of the component can be smaller than the thickness of the heat-release layer 130. Since the component may be mounted on the mounting layer 132, by making the collective thickness of the component and the mounting layer 132 smaller than the thickness of the heat-release layer 130, the package board may not have to be increased in thickness.

Referring to FIG. 1, the mounting layer 132 can have the lower surface be in contact with the first insulation layer 120 and the upper surface be in contact with the component 140. By thus having the component and the mounting layer 132 in direct contact, the heat generated in the component 140 can be effectively transferred to the mounting layer 132.

Also, as illustrated in FIG. 2, the mounting layer 132 and the heat-release layer 130 can be connected to each other. This may allow the heat that has transferred from the component to the mounting layer 132 to be efficiently transferred to the heat-release layer 130. Furthermore, there can be a difference in level at the portion where the mounting layer 132 and the heat-release layer 130 are connected, so that the package board may not have to be increased in thickness, as described above.

A component 140 may be mounted on the mounting layer 132. The component may be a light-emitting element, such as an LED, or may be any of a variety of other components. As already described above, the heat generated from such a component can be transferred to the heat-release layer 130 through the mounting layer 132, which is in direct contact with the component, to increase the effect of heat release.

Electrode portions 134 may be formed in the cavity 135 for electrical connection between the component 140 and the circuit pattern (not shown) formed in the first metal layer 110. In order to prevent short-circuiting between the electrode portions 134 and the circuit network that includes the circuit pattern (not shown) formed in the first metal layer 110, the electrode portions 134 may be formed to be isolated from the mounting layer 132 and the heat-release layer 130. In other words, the electrode portions 134 can each be separated from both the mounting layer 132 and the heat-release layer 130, as illustrated in FIG. 2.

The electrode portions 134 can be electrically connected with the component mounted on the mounting layer 132 by way of wires 142, and be electrically connected with the circuit pattern (not shown) formed in the first metal layer 110 by way of vias 162 that penetrate the first insulation layer 120.

The electrode portion 134 can be formed by bonding a conductive material onto a portion of the first insulation layer 120 exposed through the cavity 135, or can be formed by allowing a portion of the heat-release layer 130 to remain while etching the heat-release layer 130 to form the cavity 135.

The second insulation layer 150 can serve to cover the cavity 135 and the heat-release layer 130, and, when forming a multi-layer package, can function as insulation between layers.

In cases where the component embedded in the cavity 135 is a light-emitting element, such as an LED, the second insulation layer 150 can be made of a transparent material, so that light may be transmitted efficiently. In order that the insulation material may be evenly distributed throughout the inside of the cavity 135, the second insulation layer 150 can be formed by molding using a liquid insulation material.

Figure 3:
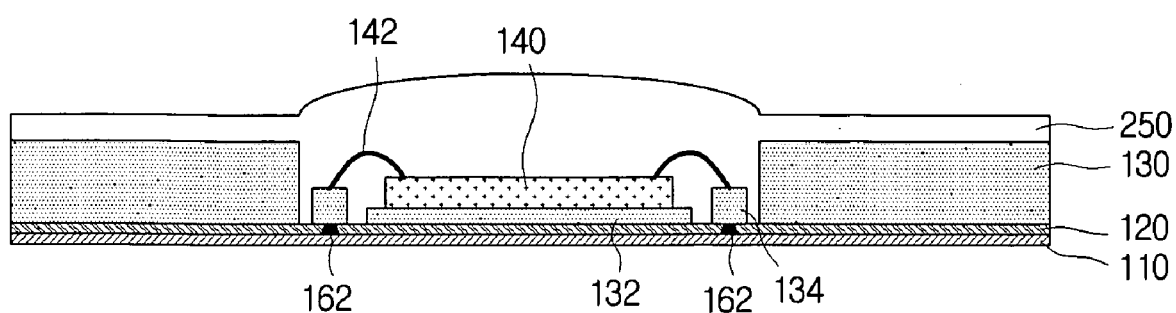
FIG. 3 is a cross-sectional view illustrating a second disclosed embodiment of a package board according to an aspect of the invention.

FIG. 3 is a cross-sectional view illustrating a second disclosed embodiment of a package board according to an aspect of the invention. One particular feature of the second disclosed embodiment illustrated in FIG. 3 is that a curve is formed in a portion of the second insulation layer 250 that covers the cavity 135.

In cases where the component embedded in the cavity 135 is a light-emitting element, such as an LED, a lens may be formed in the portion covering the cavity 135, which may serve to disperse or concentrate light. While FIG. 3 illustrates a curve of a convex shape, it is apparent that a curve of a concave shape may be formed, and that any of various other shapes may be used.

Figure 4:
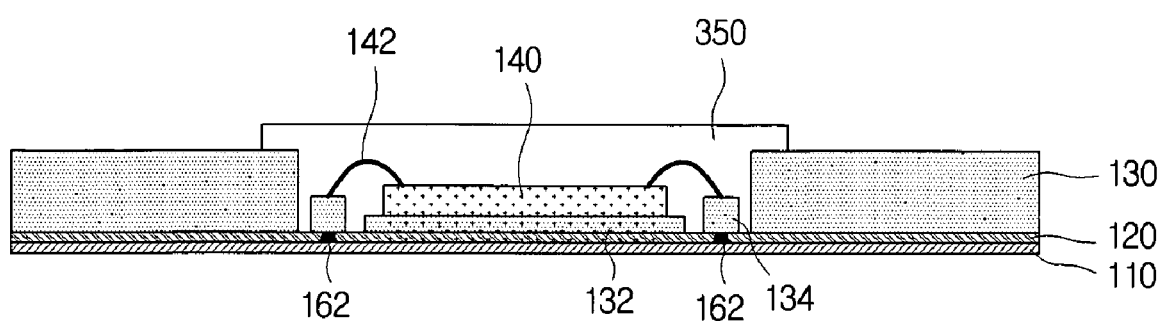
FIG. 4 is a cross-sectional view illustrating a third disclosed embodiment of a package board according to an aspect of the invention.

FIG. 4 is a cross-sectional view illustrating a third disclosed embodiment of a package board according to an aspect of the invention. One particular feature of the third disclosed embodiment illustrated in FIG. 4 is that the second insulation layer 150 is formed to cover the cavity 135 and a portion of the heat-release layer 130.

When a package board according to this embodiment is positioned on an outermost layer of a multi-layer circuit board, the effect of heat release can be maximized by having the heat-release layer 130 exposed to the exterior. It is to be appreciated that, in this embodiment also, a curve can be formed to serve as a lens, as in the second disclosed embodiment described above.

Figure 5:
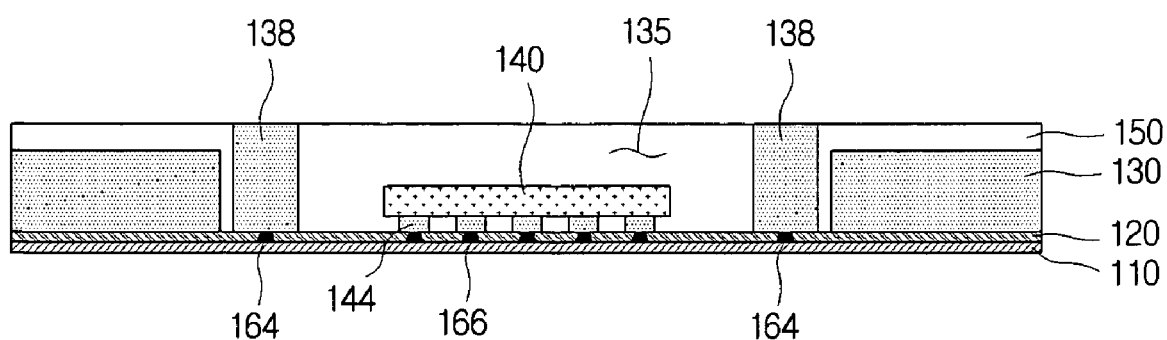
FIG. 5 is a cross-sectional view illustrating a fourth disclosed embodiment of a package board according to an aspect of the invention.

FIG. 5 is a cross-sectional view illustrating a fourth disclosed embodiment of a package board according to an aspect of the invention. In FIG. 5 are illustrated a first metal layer 110, a first insulation layer 120, a second insulation layer 150, a heat-release layer 130, pillars 138, a cavity 135, a component 140, solder 144, and vias 164, 166.

A cavity 135 may be formed in the heat-release layer 130. The cavity 135 can be formed penetrating the heat-release layer 130, so that the component 140 can be installed within. While this particular embodiment illustrates a cavity 135 that penetrates the heat-release layer 130, the cavity 135 can just as well be formed in the shape of a concave indentation, by etching only a portion of the heat-release layer 130.

Figure 9:
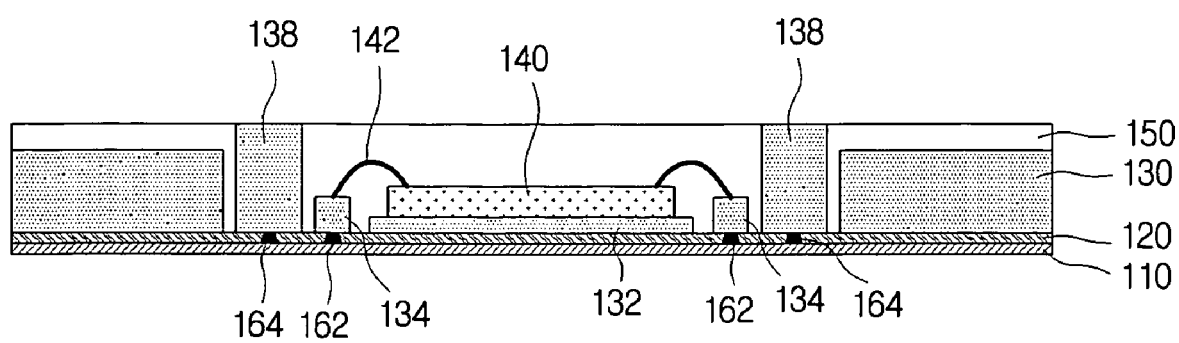
FIG. 9 is a cross-sectional view illustrating an eighth disclosed embodiment of a package board according to an aspect of the invention.

The component 140 embedded in the cavity 135 can be electrically connected with the first metal layer 110 by way of vias 166. This particular embodiment illustrates the component as being electrically connected with the first metal layer 110 by solder 144 and by vias that penetrate the first insulation layer 120. Of course, other methods may be used, as illustrated in FIG. 9, where the component may be electrically connected with the first metal layer 110 by wire bonding.

The pillars 138 may penetrate the second insulation layer 150 in isolation from the heat-release layer 130. One end of a pillar 138 can be connected with the first metal layer 110 by way of a via 164 that penetrates the first insulation layer 120, while the other end of the pillar 138 can be exposed to the exterior. In this way, the heat generated in a package according to this embodiment can readily be dispersed and released.

Figure 6:
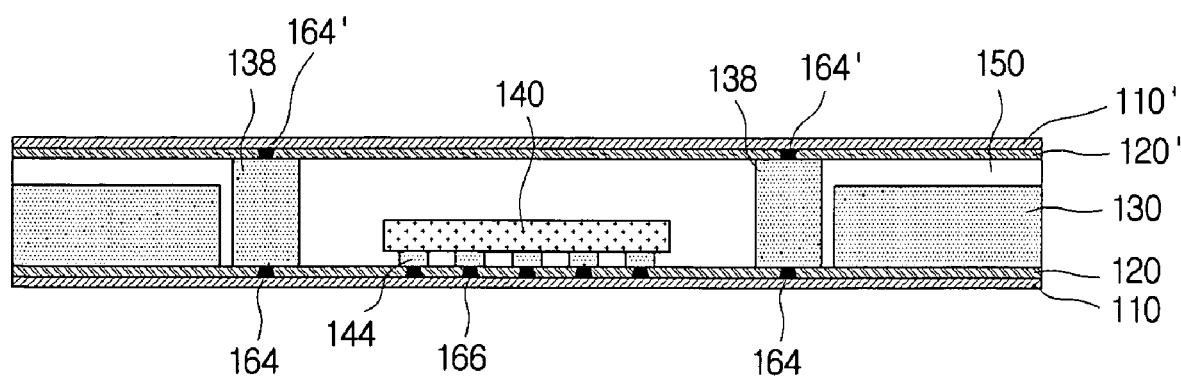
FIG. 6 is a cross-sectional view illustrating a fifth disclosed embodiment of a package board according to an aspect of the invention.

FIG. 6 is a cross-sectional view illustrating a fifth disclosed embodiment of a package board according to an aspect of the invention. In FIG. 6 are illustrated a first metal layer 110, a second metal layer 110', a first insulation layer 120, a second insulation layer 150, a third insulation layer 120', a heat-release layer 130, pillars 138, a cavity 135, a component 140, solder 144, and vias 164, 164', 166.

A package board according to this embodiment may differ from the particular package board described with reference to the fourth disclosed embodiment in that a third insulation layer 120' and a second metal layer 110' may be stacked on the second insulation layer 150, and that the second metal layer 110' and the pillars 138 may be electrically connected by vias 164'.

This can be for forming a multi-layer package board, and a particular pattern (not shown) can be formed in the second metal layer 110'. The vias 164' formed to penetrate the third insulation layer 120' may electrically connect the second metal layer 110' with the pillars 138, whereby the pillars 138 can be made to function as interlayer conduction paths that connect the first metal layer 110 and the second metal layer 110'.

Figure 7:
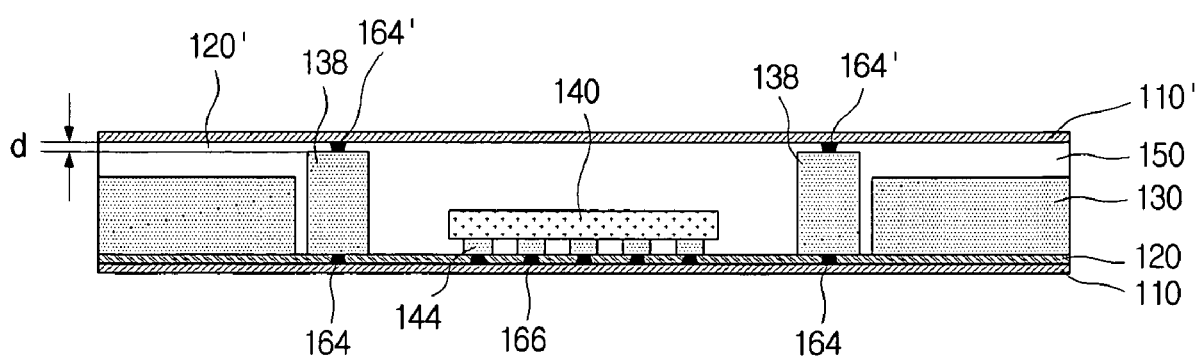
FIG. 7 is a cross-sectional view illustrating a sixth disclosed embodiment of a package board according to an aspect of the invention.

FIG. 7 is a cross-sectional view illustrating a sixth disclosed embodiment of a package board according to an aspect of the invention. A package board according to this embodiment may differ from the particular package board described with reference to the fifth disclosed embodiment in that the second insulation layer 150 and the third insulation layer 120' may be made of the same material.

If the second insulation layer 150 and third insulation layer 120' are formed from the same material, the second insulation layer 150 and the third insulation layer 120' can be stacked at the same time, when stacking the second insulation layer 150, by stacking the second insulation layer 150 with an additional thickness (d) tantamount to the thickness of the third insulation layer 120'. This can be advantageous in many cases, such as when the second insulation layer 150 is stacked by performing molding using a liquid insulation material.

Figure 8:
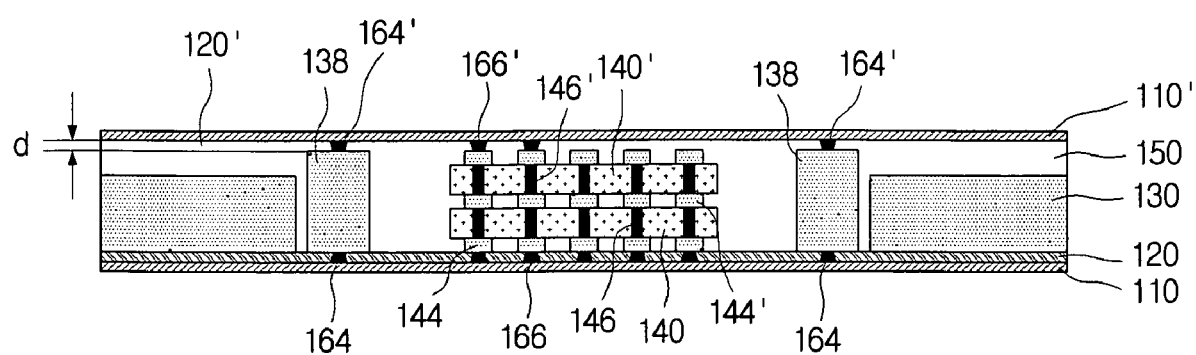
FIG. 8 is a cross-sectional view illustrating a seventh disclosed embodiment of a package board according to an aspect of the invention.

FIG. 8 is a cross-sectional view illustrating a seventh disclosed embodiment of a package board according to an aspect of the invention. In FIG. 8 are illustrated a first metal layer 110, a second metal layer 110', a first insulation layer 120, a second insulation layer 150, a heat-release layer 130, pillars 138, a cavity 135, a first component 140, a second component 140', solder 144, and vias 164, 164', 166, 166'.

A package board according to this embodiment may differ from the particular package board described with reference to the sixth disclosed embodiment in that more than one component may be embedded.

Referring to FIG. 8, a second component 140' can be stacked on the upper surface of the first component 140. Through-holes 146 can be formed in the first component 140 to electrically connect the first component 140 and second component 140', and through-holes 146' can be formed also in the second component 140'. Such through-holes 146, 146' can be utilized to implement electrical connections between layers in a simple manner.

FIG. 9 is a cross-sectional view illustrating an eighth disclosed embodiment of a package board according to an aspect of the invention. In FIG. 9 are illustrated a first metal layer 110, a first insulation layer 120, a second insulation layer 150, a heat-release layer 130, a mounting layer 132, electrode portions 134, pillars 138, a component 140, wires 142, and vias 162, 164.

The package board illustrated with reference to this embodiment can be regarded as a combination of a package board based on the first disclosed embodiment and a package board based on the forth disclosed embodiment.

That is, the pillars 138 illustrated with reference to the fifth disclosed embodiment can be formed, and the mounting layer 132 illustrated with reference to the first disclosed embodiment can be formed, to augment the heat-releasing effect.

Figure 10:
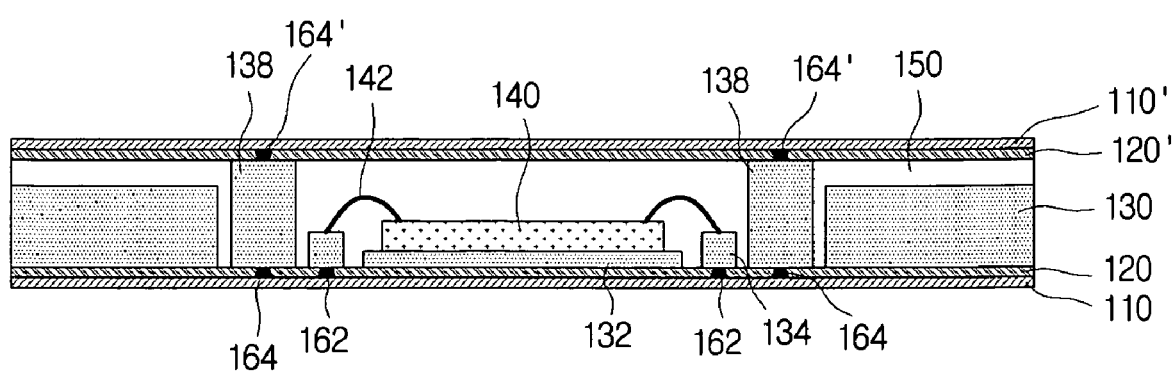
FIG. 10 is a cross-sectional view illustrating a ninth disclosed embodiment of a package board according to an aspect of the invention.

FIG. 10 is a cross-sectional view illustrating a ninth disclosed embodiment of a package board according to an aspect of the invention. Compared to the package board described with reference to the eighth disclosed embodiment, one particular feature of this embodiment is that a third insulation layer 120' and a second metal layer 110' are stacked, similar to the fifth disclosed embodiment.

This can be for forming a multi-layer package board, and a particular pattern (not shown) can be formed in the second metal layer 110'. The vias 164' formed to penetrate the third insulation layer 120' may electrically connect the second metal layer 110' with the pillars 138, whereby the pillars 138 can be made to function as interlayer conduction paths that connect the first metal layer 110 and the second metal layer 110'.

Figure 11:
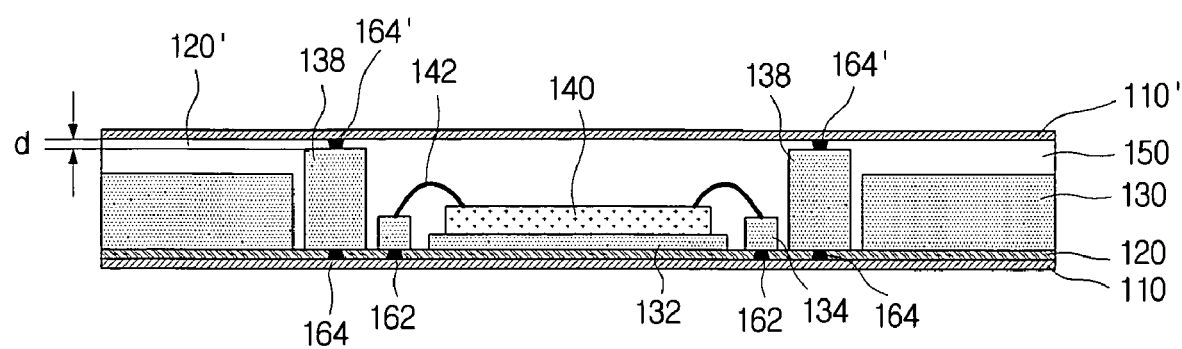
FIG. 11 is a cross-sectional view illustrating a tenth disclosed embodiment of a package board according to an aspect of the invention.

FIG. 11 is a cross-sectional view illustrating a tenth disclosed embodiment of a package board according to an aspect of the invention.

A package board according to this embodiment may differ from the particular package board described with reference to the ninth disclosed embodiment in that the second insulation layer 150 and the third insulation layer 120' may be made of the same material.

If the second insulation layer 150 and third insulation layer 120' are formed from the same material, the second insulation layer 150 and the third insulation layer 120' can be stacked at the same time, when stacking the second insulation layer 150, by stacking the second insulation layer 150 with an additional thickness (d) tantamount to the thickness of the third insulation layer 120'. This can be advantageous in many cases, such as when the second insulation layer 150 is stacked by performing molding using a liquid insulation material.

Figure 12:
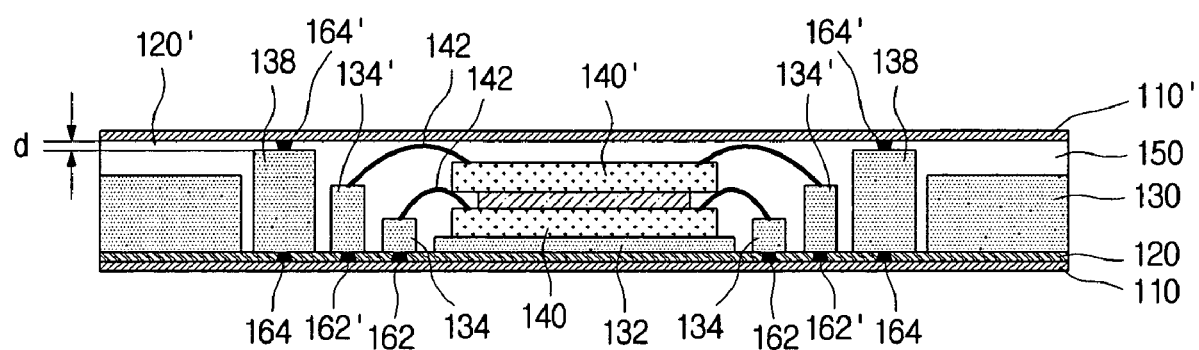
FIG. 12 is a cross-sectional view illustrating an eleventh disclosed embodiment of a package board according to an aspect of the invention.

FIG. 12 is a cross-sectional view illustrating an eleventh disclosed embodiment of a package board according to an aspect of the invention. A package board according to this embodiment may differ from the particular package board described with reference to the tenth disclosed embodiment in that more than one component may be embedded.

Referring to FIG. 12, a second component 140' can be stacked on the upper surface of the first component 140. In order to electrically connect the first component 140 and second component 140', second electrode portions 134' may be formed that are isolated from the heat-release layer 130 and the mounting layer 132, and the second component 140' can be electrically connected with the second electrode portions 134' using wire bonding. Such a structure can be utilized to implement electrical connections between layers in a simple manner.

The package board according to certain aspects of the invention has been described above with reference to the first to eleventh disclosed embodiments. While the composition and features of the embodiments have been described with reference to the respective drawings, which are limited in describing the invention, it is to be appreciated that other embodiments may readily be conceived from the composition and features of the embodiments set forth above.

A method of manufacturing a package board according to certain other aspects of the invention will now be described as follows.

Figure 13:
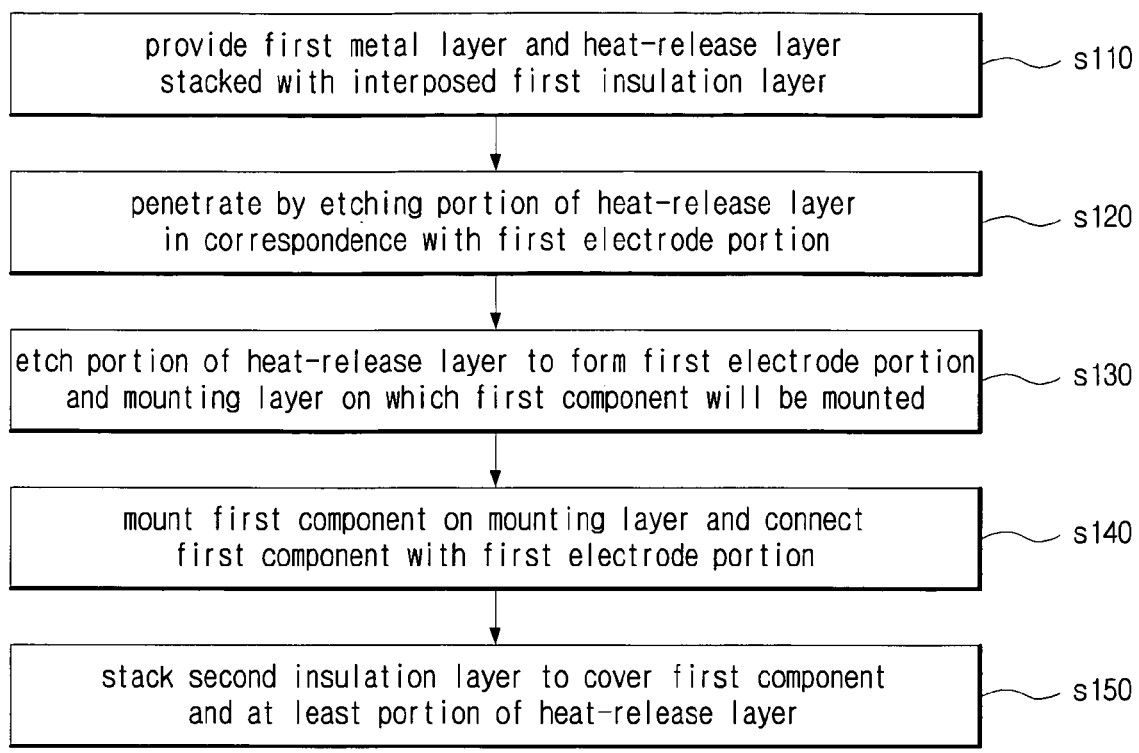
FIG. 13 is a flowchart illustrating a first disclosed embodiment of a method of manufacturing a package board according to an aspect of the invention.
Figure 14A:
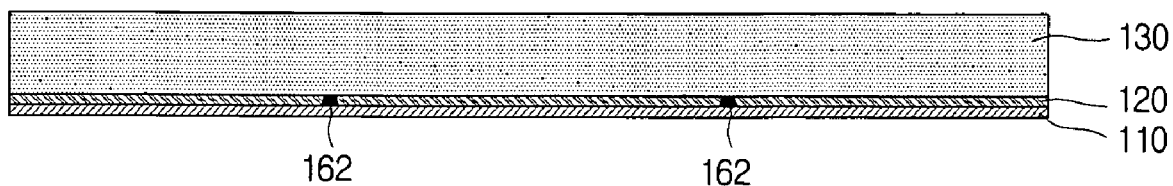
FIG. 14A, FIG. 14B, FIG. 14C, FIG. 14D, and FIG. 14E are cross-sectional views representing a flow diagram of a method of manufacturing the package board of FIG. 13.
Figure 14B:
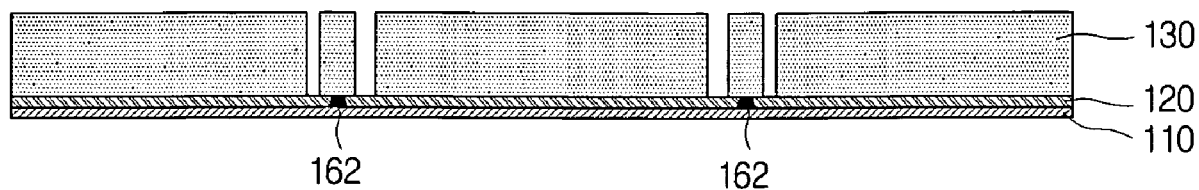
Figure 14C:
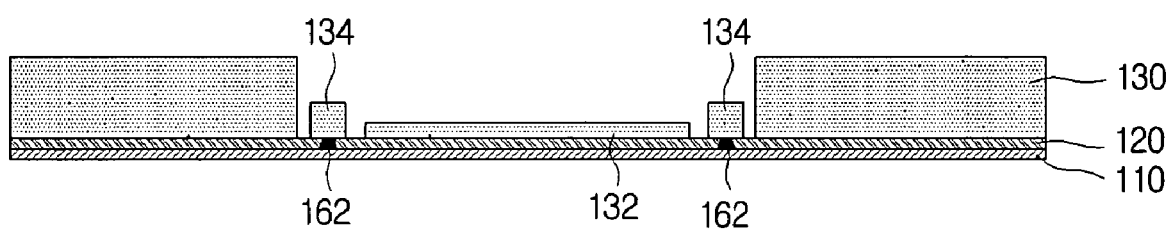
Figure 14D:
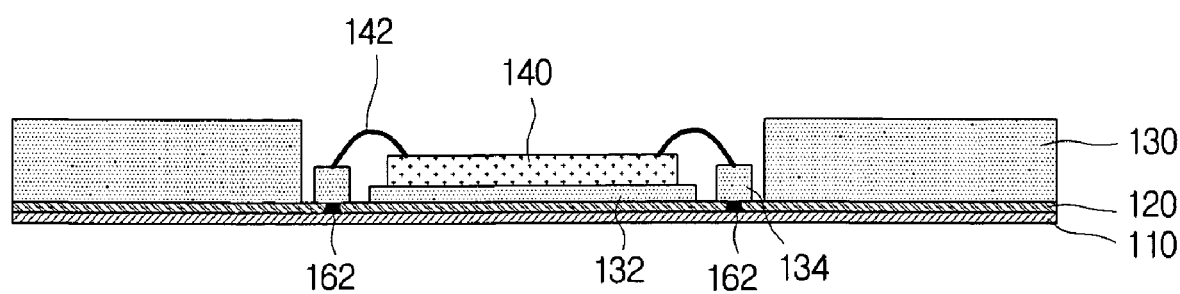
Figure 14E:
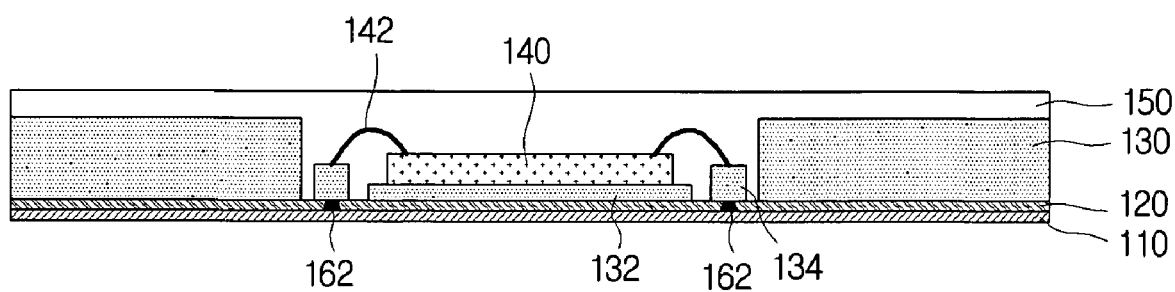

FIG. 13 is a flowchart illustrating a first disclosed embodiment of a method of manufacturing a package board according to an aspect of the invention, and FIGS. 14A to 14E are cross-sectional views representing a flow diagram of a method of manufacturing the package board of FIG. 13. In FIGS. 14A to 14E are illustrated a first metal layer 110, a first insulation layer 120, a heat-release layer 130, a mounting layer 132, electrode portions 134, a component 140, wires 142, a second insulation layer 150, and vias 162.

First, a first metal layer 110 and a heat-release layer 130 may be provided which may be stacked together with a first insulation layer 120 interposed between (s110). Here, vias 162 may be formed in the first insulation layer 120 to allow the exchange of electrical signals between layers.

A copper clad laminate (CCL) having a thick copper foil formed on one side can be used for the arrangement of the first metal layer 110 and heat-release layer 130 stacked with the first insulation layer 120 in-between. Here, the thick copper foil may correspond to the heat-release layer 130.

Next, portions of the heat-release layer 130 can be penetrated by etching, in correspondence with the first electrode portions 134 (s120). Here, the etching of the heat-release layer 130 can be performed by electropolishing or electro-discharge grinding. Etching by electropolishing or electro-discharge grinding allows minute processing, whereby a low pitch may be obtained. Of course, other methods may also be used, such as chemical etching methods. (see FIG. 14B)

Next, a mounting layer 132 and first electrode portions 134 may be formed by etching portions of the heat-release layer 130 (s130). The mounting layer 132 can be formed by etching a portion of the heat-release layer 130, where the sum of the thickness of the mounting layer 132 and the thickness of the component can be made smaller than the thickness of the heat-release layer 130. As the component may be mounted on the mounting layer 132, by making the collective thickness of the component and the mounting layer 132 smaller than the thickness of the heat-release layer 130, the package board may not have to be increased in thickness. (see FIG. 14C)

Also, since the mounting layer 132 can be formed by etching a portion of the heat-release layer 130, the mounting layer 132 and the heat-release layer 130 can be connected to each other, as illustrated in FIG. 2. This may allow the heat that has transferred from the component to the mounting layer 132 to be efficiently transferred to the heat-release layer 130.

In order to prevent short-circuiting in the circuit network, the electrode portions 134 may be formed to be isolated from the mounting layer 132 and the heat-release layer 130. In other words, the electrode portions 134 can each be separated from both the mounting layer 132 and the heat-release layer 130, as illustrated in FIGS. 14A to 14E and in FIG. 2.

Such electrode portions 134 can be electrically connected with the component 140 mounted on the mounting layer 132 by way of wires 142, and be electrically connected with the circuit pattern (not shown) formed in the first metal layer 110 by way of vias 162 that penetrate the first insulation layer 120.

Next, the component 140 may be mounted on the mounting layer 132, and the first component 140 and the first electrode portions 134 may be connected (s140). By having the first component 140 be in direct contact with the mounting layer 132, the heat generated in the component 140 can be effectively transferred to the mounting layer 132. The connection between the first component 140 and the first electrode portions 134 can be implemented using wires 142. (see FIG. 14D)

Next, a second insulation layer 150 may be stacked which covers the first component 140 and at least a portion of the heat-release layer 130 (s150). The second insulation layer 150 can serve to cover the component 140 and the heat-release layer 130, and, when forming a multi-layer package, can function as insulation between layers. (see FIG. 14E)

In cases where the component 140 embedded in the cavity 135 is a light-emitting element, such as an LED, the second insulation layer 150 can be made of a transparent material, so that light may be transmitted efficiently. In order that the insulation layer may be evenly distributed throughout the inside of the cavity 135, the second insulation layer 150 can be formed by molding using a liquid insulation material.

As illustrated in FIG. 3, a curve may be formed in a portion of the second insulation layer 150 covering the component 140, and as illustrated in FIG. 4, the second insulation layer 150 may also be formed to cover a portion of the heat-release layer 130 and the component 140.

When embedding multiple components, as illustrated in FIG. 12, the electrode portions may be formed in correspondence to the number of components embedded. The method of forming each of the electrode portions may be substantially the same as the method described above for forming the first electrode portions 134, and thus the details will not be repeated.

Moreover, if the component 140 is a light-emitting element, a second metal layer 110' may be stacked on the second insulation layer 150, and a particular pattern, e.g. slits, may be formed, in order that the light generated from the component 140 may be selectively transmitted.

Figure 15:
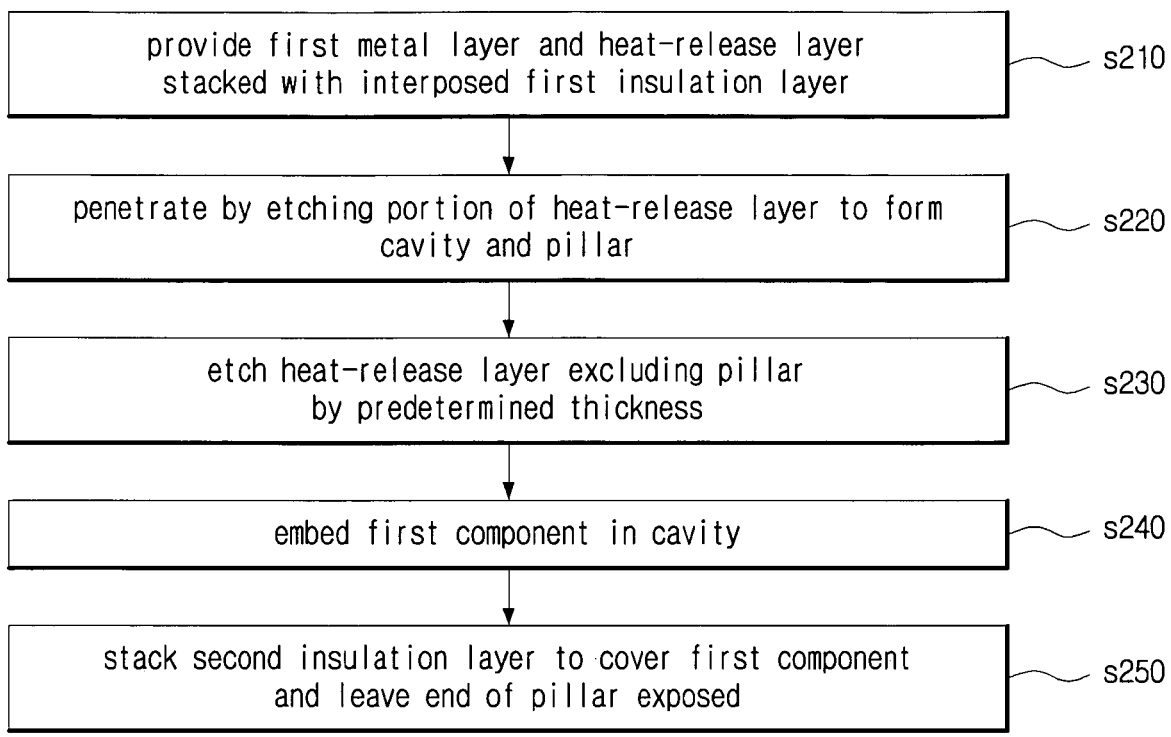
FIG. 15 is a flowchart illustrating a second disclosed embodiment of a method of manufacturing a package board according to an aspect of the invention.

FIG. 15 is a flowchart illustrating a second disclosed embodiment of a method of manufacturing a package board according to an aspect of the invention, and FIGS. 16A to 16F are cross-sectional views representing a flow diagram of a method of manufacturing the package board of FIG. 15. In FIGS. 16A to 16F are illustrated a first metal layer 110, a second metal layer 110', a first insulation layer 120, a second insulation layer 150, a third insulation layer 120', a heat-release layer 130, pillars 138, a cavity 135, a component 140, solder 144, and vias 164, 164', 166.

First, a first metal layer 110 and a heat-release layer 130 stacked together with a first insulation layer 120 interposed between may be provided (s210). Here, vias may be formed in the first insulation layer 120 to allow the exchange of inter-layer signals.

A copper clad laminate (CCL) having a thick copper foil formed on one side can be used for the arrangement of the first metal layer 110 and heat-release layer 130 stacked with the first insulation layer 120 in-between. Here, the thick copper foil may correspond to the heat-release layer 130. (see FIG. 16A)

Figure 16A:
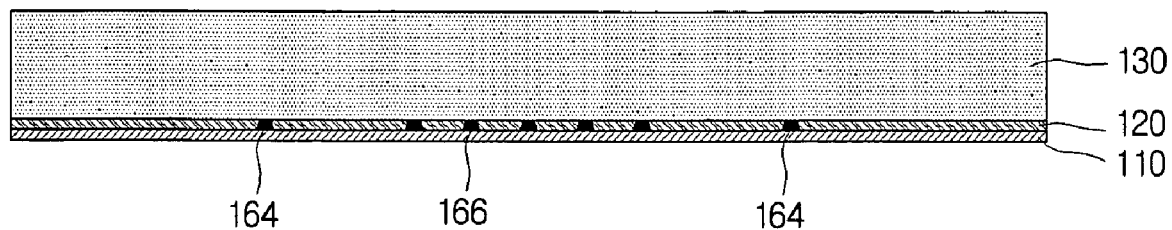
FIG. 16A, FIG. 16B, FIG. 16C, FIG. 16D, FIG. 16E and FIG. 16F are cross-sectional views representing a flow diagram of a method of manufacturing the package board of FIG. 15.
Figure 16B:
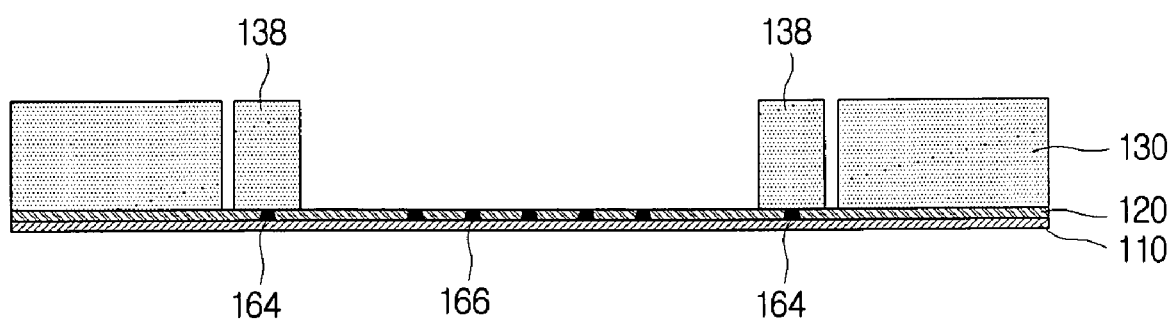
Figure 16C:
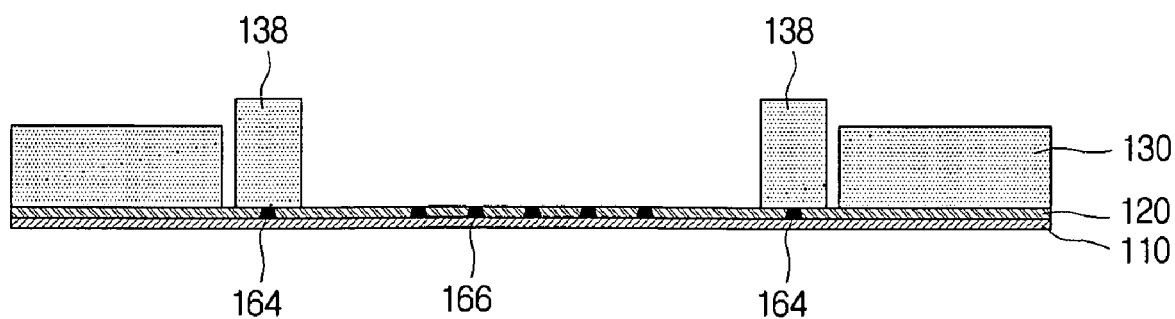

Next, a cavity 135 and pillars 138 may be formed by etching portions of the heat-release layer 130 such that the portions are penetrated (s220), and the heat-release layer 130 excluding the pillars 138 may be etched by a particular thickness (s240). Examples of these processes are illustrated in FIGS. 16B and 16C.

Figure 16D:
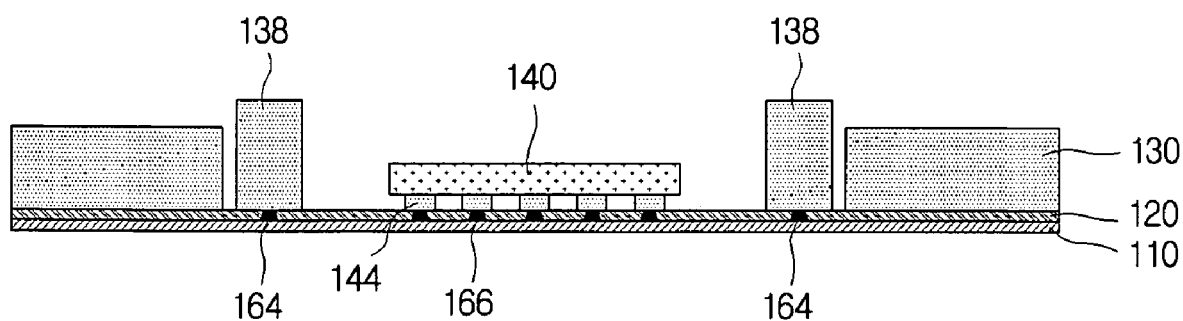

Next, a first component 140 may be embedded in the cavity 135 (s240). The first component 140, which is to be embedded in the cavity 135, can be electrically connected with the circuit pattern (not shown) of the first metal layer 110, by way of solder 144 and vias 166 that penetrate the first insulation layer 120. A first component 140 embedded in a cavity 135 is illustrated in FIG. 16D.

Next, a second insulation layer 150 may be stacked to cover the cavity 135 and the heat-release layer 130 (s250). The second insulation layer 150 can serve to cover the component 140 and the heat-release layer 130, and, when forming a multi-layer package, can function as insulation between layers.

In certain cases, the second insulation layer 150 may be stacked with one end of each of the pillars 138 exposed. In this way, the fourth disclosed embodiment of a package board according to an aspect of the invention, as illustrated in FIG. 5, may be implemented.

Figure 16E:
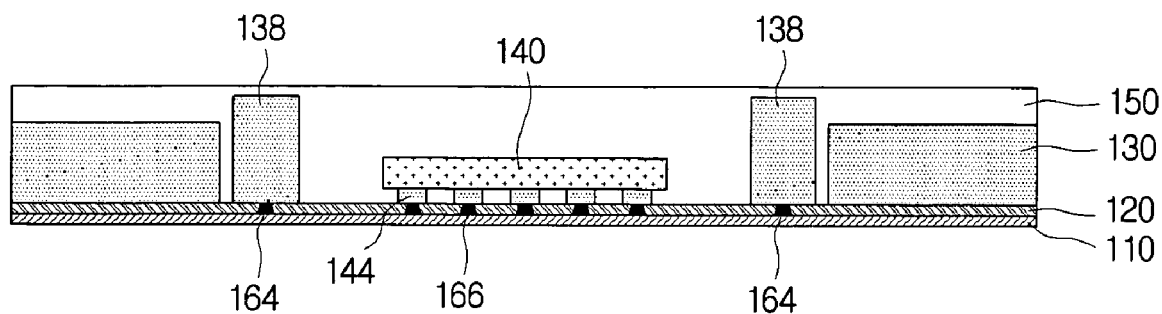
Figure 16F:
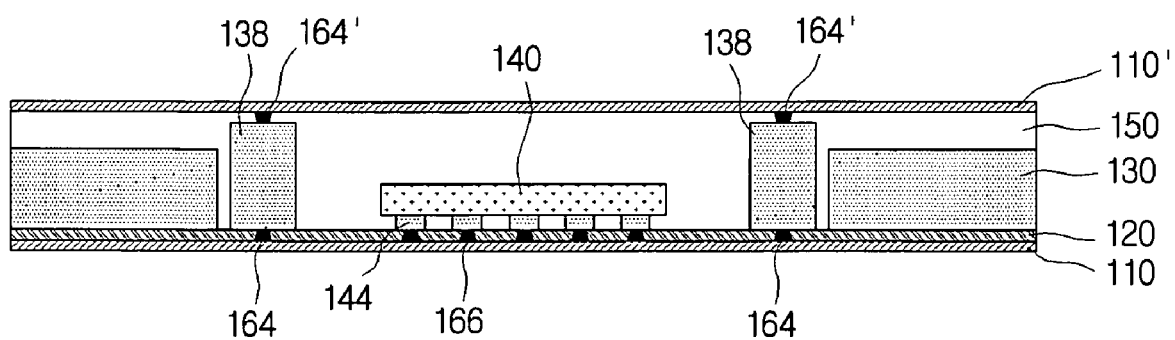

To manufacture a package board having multiple layers, a third insulation layer 120' can be stacked over the second insulation layer 150, which is stacked such that the ends of the pillars 138 are exposed, and a second metal layer 110' may be stacked over the third insulation layer 120' (s260), as illustrated in FIG. 5. For simpler processes, the second insulation layer 150 and third insulation layer 120' can be formed from the same material. For example, when forming the second insulation layer 150 by performing molding using a liquid insulation material, the second insulation layer 150 and third insulation layer 120' can be formed at the same time, by performing molding to an additional thickness tantamount to the thickness of the third insulation layer 120'. FIG. 16E illustrates a second insulation layer 150 and a third insulation layer 120' that are made of the same material.

A pre-designed pattern (not shown) can be formed in the second metal layer 110', which can be a circuit pattern that enables a flow of electrical signals, or, when the component 140 is a light-emitting element, a slit that enables light generated from the component 140 to be transmitted selectively.

In cases where a circuit pattern (not shown) is formed in the second metal layer 110', the pillars 138 may function as interlayer conduction paths that connect the circuit patterns (not shown) formed respectively in the first metal layer 110 and the second metal layer 110'. For this, the second metal layer 110' and the pillars 138 can be connected with each other by way of vias 164'. FIG. 16E illustrates pillars 138 that are connected with the second metal layer 110' by vias 164'.

Figure 17:
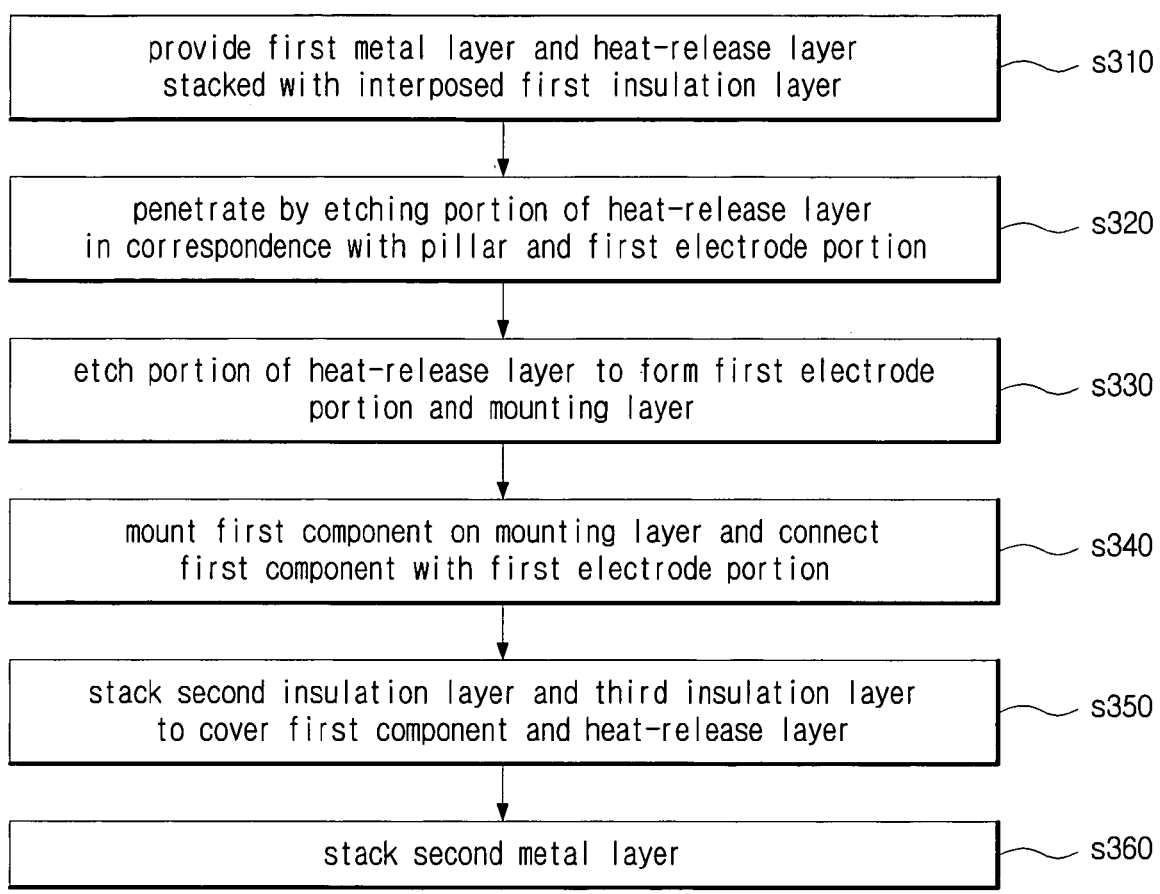
FIG. 17 is a flowchart illustrating a third disclosed embodiment of a method of manufacturing a package board according to an aspect of the invention.

FIG. 17 is a flowchart illustrating a third disclosed embodiment of a method of manufacturing a package board according to an aspect of the invention, and FIGS. 18A to 18F are cross-sectional views representing a flow diagram of a method of manufacturing the package board of FIG. 17. The method of manufacturing a package board illustrated with reference to this embodiment can be regarded as a combination of a method based on the first disclosed embodiment and a method based on the second disclosed embodiment for a method of manufacturing a package board.

Figure 18A:
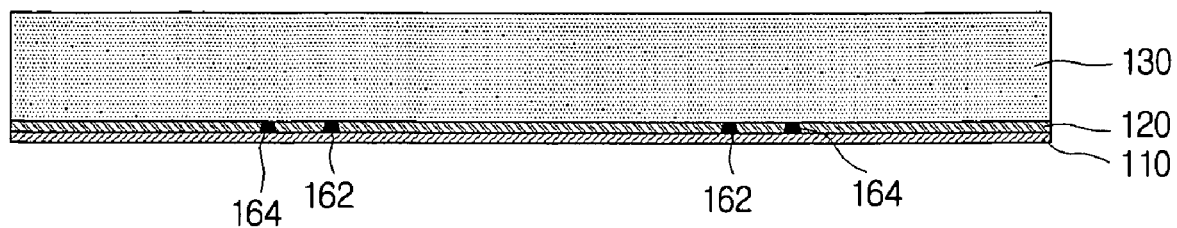
FIG. 18A, FIG. 18B, FIG. 18C, FIG. 18D, FIG. 18E and FIG. 18F are cross-sectional views representing a flow diagram of a method of manufacturing the package board of FIG. 17.

First, a first metal layer 110 and a heat-release layer 130 stacked together with a first insulation layer 120 interposed between may be provided (s310). Here, vias 162, 164 may be formed in the first insulation layer 120 to allow the exchange of electrical signals between layers. (FIG. 18A)

Figure 18B:
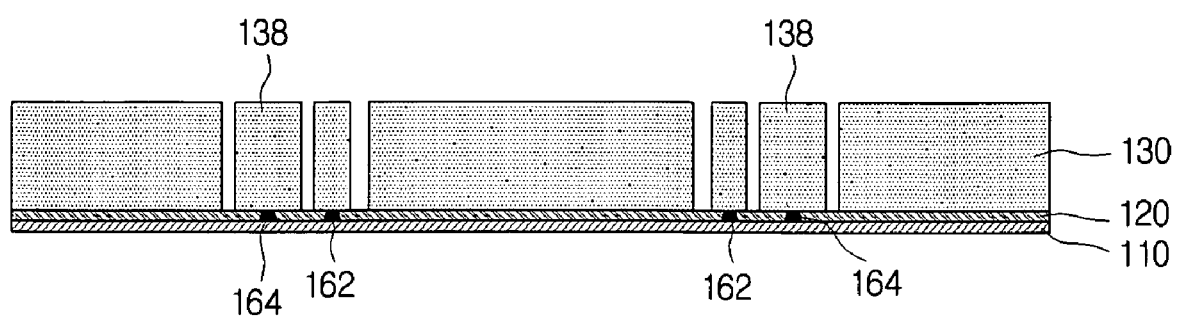
Figure 18C:
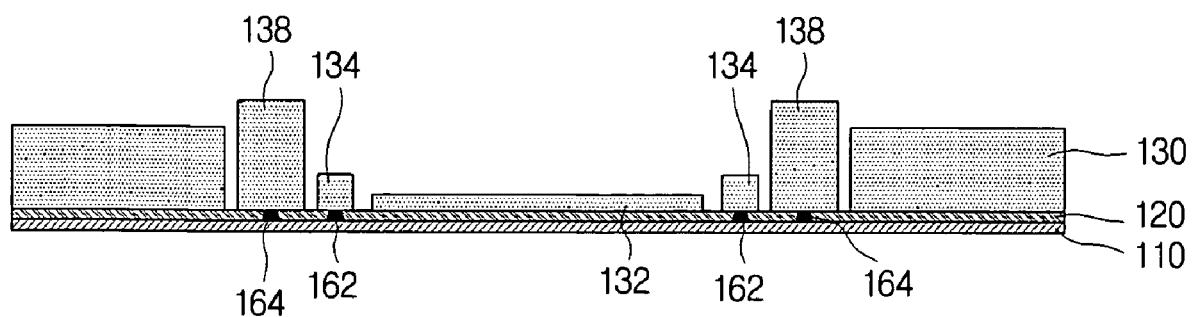

Next, portions of the heat-release layer 130 can be penetrated by etching, in correspondence with pillars 138 and first electrode portions 134 (s320). The heat-release layer 130 thus etched is illustrated in FIG. 18B.

Next, first electrode portions 134 and a mounting layer 132 may be formed by etching portions of the heat-release layer 130 (s330). The first electrode portions 134 and the mounting layer may be formed by etching, whereas the pillars 138 may be used intact without additional etching. (see FIG. 18C)

Figure 18D:
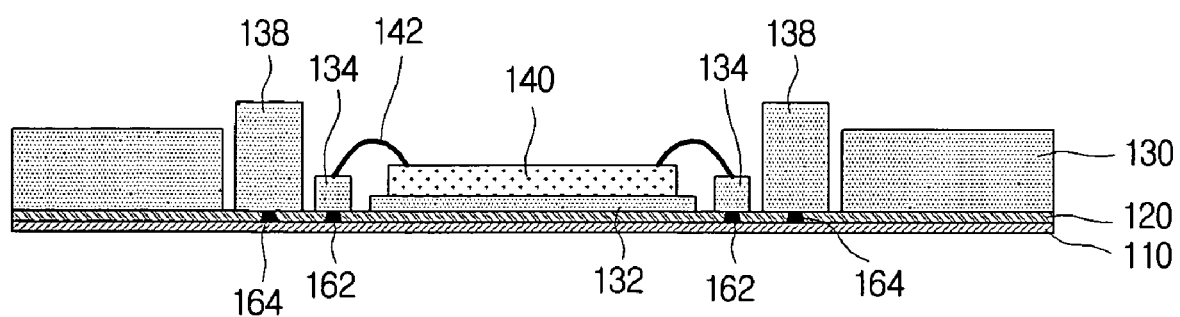
Figure 18E:
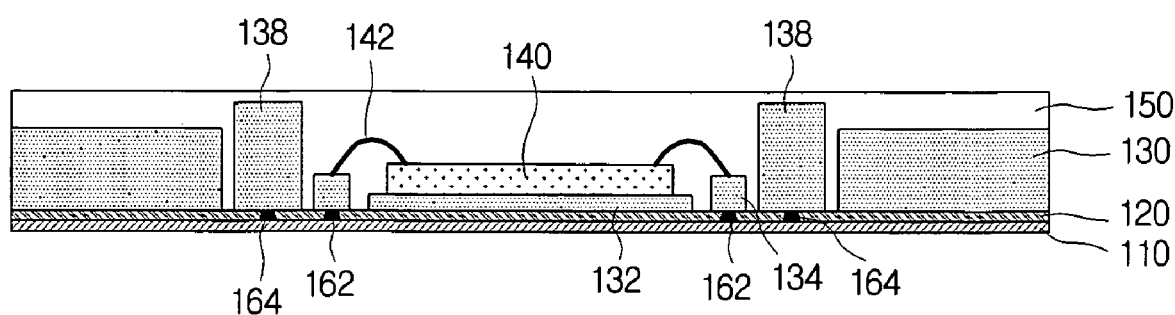
Figure 18F:
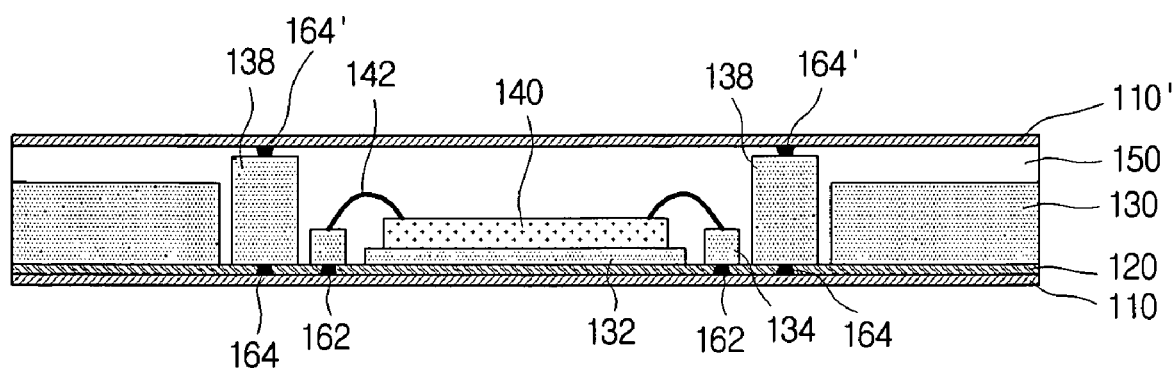

Next, a first component 140 may be mounted on the mounting layer 132, and the first component 140 and the first electrode portions 134 may be connected together (s340). The connection between the first component 140 and the first electrode portions 134 can be implemented by wire bonding. This is illustrated in FIG. 18D.

Next, a second insulation layer 150 may be stacked which covers the first component 140 and the heat-release layer 130, and a third insulation layer 120' may be stacked (s350). As described above, the second insulation layer 150 and third insulation layer 120' can be formed from the same material, and can be formed at the same time by performing molding using a liquid insulation material. (see FIG. 18E)

Next, a second metal layer 110' may be stacked on (s360). As already described above, a circuit pattern (not shown) can be formed in the second metal layer 110', in which case the circuit pattern (not shown) of the second metal layer 110' and the pillars 138 can be connected using vias 164', so that the pillars 138 may function as interlayer conduction paths. Besides a circuit pattern, slits may be formed for selective light transmission. (see FIG. 18F)

It is apparent that with this embodiment also, when multiple components are to be embedded, the electrode portions can be formed in correspondence to the number of components, the components may be mounted vertically, and each of the components may be connected to electrode portions by additional wire bonding, etc.

According to certain aspects of the invention as set forth above, by positioning a component to be in direct contact with a metal layer, the heat-releasing effect can be improved, and the package can be made thinner.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention and that numerous embodiments other than those described herein are encompassed within the invention.

What is claimed is:

1. A package board comprising:
a first metal layer;
a heat-release layer stacked on the first metal layer with a first insulation layer interposed in-between, the heat-release layer being made of a metallic material;
a cavity formed in the heat-release layer;
a mounting layer formed in the cavity in contact with the first insulation layer, the mounting layer being made of a metallic material and directly connected to the heat-release layer;
a first component mounted on the mounting layer, a lower surface of the first component being in contact with the mounting layer, and a heat generated in the first component being transferred to the heat-release layer through the mounting layer;
a first electrode portion isolated from the mounting layer and the heat-release layer, the first component and the first electrode portion being electrically connected by wire bonding, and the first electrode being connected to the first metal layer through a via penetrating the first insulation layer; and
a second insulation layer covering at least a portion of the heat-release layer and the cavity.

2. The package board of claim 1, wherein the first component is a light-emitting element.

3. The package board of claim 2, wherein a curve is formed in a portion of the second insulation layer covering the cavity.

4. The package board of claim 1, wherein a sum of a thickness of the mounting layer and a thickness of the first component is smaller than a thickness of the heat-release layer.

5. The package board of claim 1, wherein the second insulation layer is made of a transparent material.

6. The package board of claim 1, further comprising:
a second component mounted on an upper surface of the first component; and
a second electrode part isolated from the mounting layer and the heat-release layer,
wherein the second component and the second electrode portion are electrically connected by wire bonding.

7. The package board of claim 2, further comprising:
a second metal layer stacked on the second insulation layer,
wherein a pre-designed pattern is formed in the second metal layer such that light generated by the first component is selectively transmitted.

* * * * *